United States Patent
Sanchez et al.

(10) Patent No.: US 9,455,174 B2
(45) Date of Patent: Sep. 27, 2016

(54) DEVICE AND METHOD FOR INDIVIDUAL SUPPORT OF COMPONENTS

(71) Applicant: COMMISSARIAT A L'ENERGIE ATOMIQUE ET AUX ENE ALT, Paris (FR)

(72) Inventors: Loic Sanchez, Voiron (FR); Laurent Bally, Jarrie (FR); Brigitte Montmayeul, Bernin (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 452 days.

(21) Appl. No.: 13/932,451

(22) Filed: Jul. 1, 2013

(65) Prior Publication Data
US 2014/0044516 A1 Feb. 13, 2014

(30) Foreign Application Priority Data
Jul. 3, 2012 (FR) ...................................... 12 56361

(51) Int. Cl.
*H01L 21/683* (2006.01)
*H01L 21/673* (2006.01)

(52) U.S. Cl.
CPC ......... *H01L 21/6838* (2013.01); *H01L 21/673* (2013.01); *H01L 21/67333* (2013.01); *Y10T 29/49819* (2015.01); *Y10T 29/49998* (2015.01); *Y10T 29/53091* (2015.01); *Y10T 29/53165* (2015.01); *Y10T 29/53174* (2015.01); *Y10T 29/53961* (2015.01)

(58) Field of Classification Search
CPC ............. H01L 21/6838; H01L 21/673; H01L 21/67333; Y10T 29/53961; Y10T 29/53091; Y10T 29/53174; Y10T 29/53165; Y10T 29/49998; Y10T 29/49819
See application file for complete search history.

(56) References Cited

U.S. PATENT DOCUMENTS

| 5,374,888 A | 12/1994 | Karasawa |
| 5,375,710 A | 12/1994 | Hayakawa et al. |

(Continued)

FOREIGN PATENT DOCUMENTS

| JP | 63-16277 | 1/1988 |
| JP | 6-298290 | 10/1994 |

(Continued)

OTHER PUBLICATIONS

French Preliminary Search Report issued Mar. 6, 2013 in French 12 56361, filed on Jul. 3, 2012 ( with English Translation of category of cited documents).

*Primary Examiner* — John C Hong
(74) *Attorney, Agent, or Firm* — Oblon, McClelland, Maier & Neustadt, L.L.P.

(57) ABSTRACT

A system is provided for individually supporting at least one component having opposing front and back faces, including a supporting device having a plurality of cells each delimited by a wall and having a contact zone to support the component, at least a part of the cells each receiving a component by its front face, the supporting and contact zones are configured so a surface of the front face is not in contact with the wall, the contact zone is located on a periphery of the front face and forms a closed zone around the front face, the supporting zone forms a closed zone on the wall, and the contact zone includes an edge surface set back in a thickness direction with respect to the front face, the thickness direction extending from the front to the back face perpendicular to at least one of the faces.

8 Claims, 7 Drawing Sheets

(56) References Cited

U.S. PATENT DOCUMENTS

2003/0231469 A1 12/2003 Ono et al.
2005/0194668 A1 9/2005 Enquist et al.
2005/0274003 A1 12/2005 Lee
2011/0033976 A1 2/2011 Di Cioccio et al.

FOREIGN PATENT DOCUMENTS

| JP | 7-176511 | 7/1995 |
| JP | 2001-35871 | 2/2001 |
| JP | 2005-123441 | 5/2005 |
| WO | WO 2006/043000 A2 | 4/2006 |
| WO | WO 2011/144687 A1 | 11/2011 |

DEVICE AND METHOD FOR INDIVIDUAL SUPPORT OF COMPONENTS

TECHNICAL FIELD OF THE INVENTION

The present invention relates to a system for supporting components wherein each component can be individually supported.

The invention also relates to a method for transferring components.

The components concerned may, not exclusively, be electronic, optical, mechanical chips, or, more generally any component produced by microelectronic means, also called chips or vignettes. For example, the invention may be applied to the context of direct gluing (i.e. by molecular adhesion, with no addition of binder) of chips in photonic applications or microelectronic devices as those having a three-dimension architecture, wherein components are superimposed in several layers stacked so as to increase the integration density.

Generally speaking, the components are objects containing electronic circuits with a micrometric or millimetric size which must be positioned on a substrate, for example a silicon layer.

STATE OF THE ART

The technique of direct gluing is a good illustration of the difficulties met during the operations carried out on individual, i.e. physically dissociated and separately handleable components. Direct gluing is extremely sensitive to the degree of property of the surface to be glued. As chips are typically originating from a common support, also called a <<wafer>> from which the components are cut off, many particles are generated and must be removed by cleaning the chips, at least on the surface of the component which will be in contact with the receiving substrate upon gluing. Cleaning quality is essential but cleaning must also meet productivity requirements. For this purpose, a collective cleaning is implemented, a phase during which the components must be held on a unique support so that they can be more easily handled and collectively transferred into processing machines.

Some means are known to collectively hold components on a support. The first of these is the component cutting support: a wafer integrating the plurality of components is glued onto an adhesive film stretched on a metallic bow for the cutting step. Once cut off, the components may be cleaned on this support, which may theoretically include the application of a pressurized fluid jet, the brushing of the surface of the components and/or a centrifugal drying. But the presence of a plastic film is not adapted to at least a part of some of such technological phases. This more particularly concerns plasma-cleaning. And the components still must be unglued from the plastic film subsequently by gripping these by the front face thereof, i.e. the face prepared for gluing thereof.

Supports such as those of the Fluorware® brand are cassettes made of plastic materials. They are not adapted to resist aggressive surface treatments of the plasma type, for example by $O_2$ or UV (Ultraviolet)/$O_3$ bombardment. Efficiency of the provided hold is found limited, too, so that most mechanical cleaning techniques (brushing or megasound for example) are excluded. Optimized cassettes known from the <<Gel Pak®>> trademark exist, wherein a stronger temporary resistance is possible thanks to a self-adhesive polymer film. The components are glued onto the film by the back face thereof and cleaned by the opposite face thereof, called here the front face. But releasing same from the cassettes is then extremely complex: a grated support under the self-adhesive film enables the application of suction which deforms and applies the film onto a grate and thus reduces the surface of contact between the film and the back face of the components. This very specific technology is not compatible with usual microelectronic equipment and the self-adhesive film does not resist aggressive treatments such as those mentioned above. No heat treatment is possible. Then again, when gripping the components, these are in contact with the moving heads, by their front face. This may affect the surface quality of the front faces.

Thus a need exists for improving the support of components wherein the components are individually held, while ensuring a better property of at least one of the faces thereof.

SUMMARY

The present invention makes it possible to remedy the whole or a part of the drawbacks of the presently known techniques.

More particularly, one aspect of the invention relates to a system for individually supporting components, comprising at least one component each comprising a front face and a back face opposite the front face, and a supporting device comprising a member supporting said components, characterized in that the supporting member is provided with cells, each one being delimited by a wall, with at least a part of the cells each receiving a component by the front face thereof, with the cells including a zone supporting a contact zone of the component, with the supporting zone and the contact zone being so configured that the surface of the front face of the component is not in contact with the wall of the cell. Thus, the surface of the front face is advantageously not in contact with the bottom wall of the cell wall.

Whereas a constant prejudice exists, which consists in thinking that the components, such as chips, the front face of which must be glued onto a substrate, must rest, through a planar contact of the front face thereof, on a plane of the support before being transferred, the invention provides for the release of the front face still positioned opposite the support. The components can thus be handled by the back face thereof, which is accessible, while avoiding the front face thereof being damaged. It should be noted, for example, that in the case of direct gluing of components on a substrate, any defect in the surface quality of the front face to be glued affects the efficiency of the bonding obtained when gluing. The invention, which preserves the front face prior to gluing, significantly improves the quality of gluing.

According to one aspect of the embodiments of the invention, the component has an advantageous configuration wherein the contact zone is located on the periphery of the front face and includes an edge surface set back with respect to the front face, such edge surface being a closed zone, like the supporting zone. In this optional embodiment, the contact zone and the supporting zone cooperate so that relative tightness is allowed. This more particularly enables applying suction for holding the component. Additionally, the relative application of the component and of the supporting device is shifted with respect to the front face, so that the latter is significantly protected. Besides, the component is then wedged thanks to the cooperation of a closed zone of the contact zone, which is set back, and a closed zone of the supporting zone.

In other aspects of the embodiments, the invention also relates to a method for transferring components, each one comprising a front face and a back face opposite the front face, with the method comprising a step of turning over the components, characterized in that the step of turning over includes:—the application of a supporting member around said components, with the supporting member including cells each one being delimited by a wall, at least a part of the cells each receiving a component by the front face thereof, with the cells including a supporting zone for the contact zone of the component, with the supporting zone and the contact zone being so configured that the surface of the front face of the component is not in contact with the wall of the cell, a rotation of the supporting member so as to turn over the components.

BRIEF DESCRIPTION OF THE FIGURES

The Figures belonging to the present application show exemplary, indicative but not restrictive embodiments.

DETAILED DESCRIPTION OF PARTICULAR EMBODIMENTS

Figure 1:
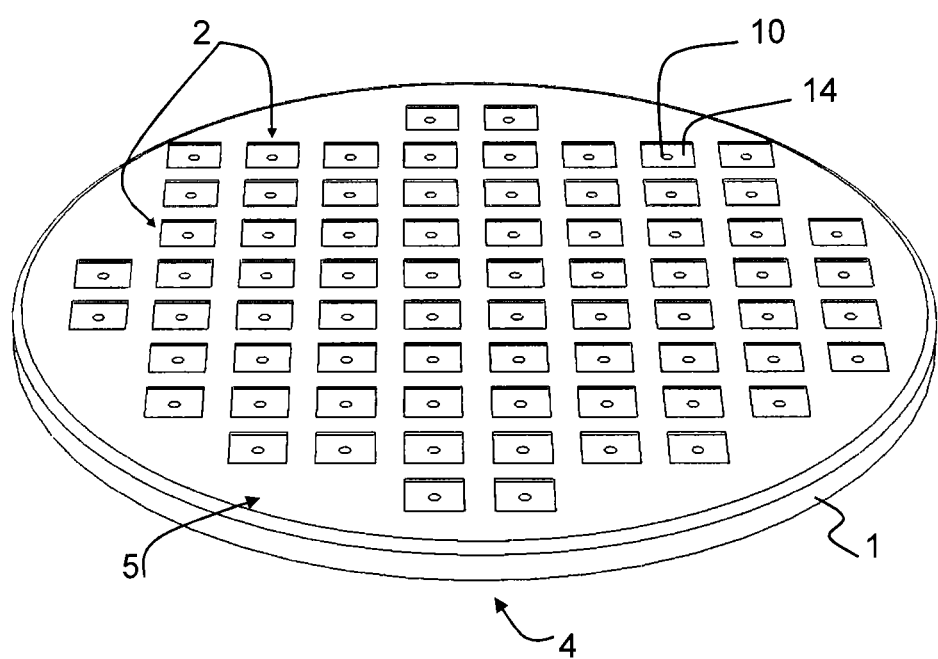
FIG. 1 illustrates a perspective view of a supporting device which can be used in a particular embodiment of the invention.

Optional characteristics which may be used in association or alternately are given hereinafter prior to making a detailed list of the embodiments of the invention:

the contact zone of the at least one component is located on the periphery of the front face of said component;

the contact zone forms a closed zone around the front face and the supporting zone forms a closed zone on the wall of the cell.

The component thus has a complete frame on a support, a frame delimiting, in the cell, a closed volume between the front face of the component and the walls of the cell.

the contact zone includes an edge surface set back with respect to the front face;

the wall of the cell and the edge surface are so configured as to free a space of at least 100 micrometers between the front face and a bottom part of the wall of the cell;

the cells include an aperture, a bottom and a stepped part of the wall located at an intermediary depth between the bottom and the aperture, with said stepped part of the wall forming at least partially the supporting zone;

the contact zone and the supporting zone form a planar support along a plane parallel to a plane of the front face;

the contact zone is at least a border part of the front face;

at least a part of the supporting zone is carried by a sloping part of the walls of the cells forming a narrowed section toward the bottom of the cell;

the contact zone and the supporting zone are so configured as to expose the back face of the component at a height above that of the aperture of the cell;

the supporting member includes a suction circuit opening into each cell and so configured that the component has its front face recessed with respect to its back face;

the supporting device includes a receiving plate provided with a plurality of cavities, each one being able to receive a component by the back face thereof, and for each cavity, at least one suction conduit opening into said cavity so that one component positioned in said cavity has its back face recessed with respect to the front face thereof, with the receiving plate and the supporting member being so configured that at least a part of the cavities is located opposite at least a part of the cells when a front face of the supporting member is opposite an upper face of the receiving plate;

at least one conduit of at least one cavity opens into a bottom wall of the cavity;

the at least one cavity for which at least one conduit opens into the bottom wall of the cavity is so configured that the back face of a component positioned in said cavity rests on the surface of the bottom wall.

the device includes a suction circuit linking at least two conduits and a fluid connection aperture.

Advantage is then taken of the mutualization of the means supporting the components: a plate is enough for individually holding the components and a unique suction circuit can be employed for the whole or a part of the conduits opening into the cavities.

the device also comprises a base whereon the receiving plate is placed, with the suction circuit being formed, partly comprising the conduits, in the receiving plate and partly comprising the connection aperture in the base.

The base may efficiently be a part of the suction circuit with simple manufacturing operations. The base is advantageously an interface element between the receiving plate (the design of which, such as the shape of the cavities, is adapted to the type of components to be received) and an outside member such as a machine support whereon the device must be mounted to process the components (commonly called <<chuck>>). This may be a cleaning machine using mega-sounds or a machine for gluing the components on a receiving substrate. In this case, the base is adapted to the mounting on the operating machine. A base may be used for several receiving plates. A receiving plate, adapted to one type of components cooperates with several different bases, each one being adapted to cooperation with a treatment machine may also be considered.

the base is a plate on an upper face of which a lower face of the receiving plate is applied, with the cavities being open on an upper face of the receiving plate opposite the lower face.

the suction circuit comprises recessed channels on the upper face of the base.

the components are electronic chips.

the front faces of the components are located in the same plane.

The method of the invention may include at least one of the following optional steps:

use of a system as described above;

forming the components on a substrate so that the back face thereof is joined to the substrate, application of the supporting member onto said components, and, after pivoting, releasing the components by removing the substrate until the back face of said components is reached;

prior to the step of turning over, supporting, by the back face thereof, the components by a receiving plate, with the pivot of the supporting member being operated simultaneously with a pivot of the receiving plate;

cleaning of the front face of the components prior to the application of the supporting member;

the supporting zone and the contact zone are in contact only when the supporting member has started rotating;

the method may include a phase of turning over the components, with the components being received in the receiving plate prior to the phase of turning over, with the phase of turning over comprising: a rotation of the receiving plate to a releasing position, while maintaining the application of a depression between the back face of the components and the front face of the components, so as to hold these in the cavities, with the releasing position being so configured that stopping applying a depression entails a gravity fall of the components; positioning the receiving plate and the supporting member in a relative position so that the front face of the components is opposite a cell, with the contact zones facing the supporting zones, while maintaining the application of a depression, so as to maintain these in the cavities; and stopping the application of a depression, so that the contact zones of the components rest on the supporting zones of the cells by gravity.

Cavity 2 or cell 41 mean any structural disposition able to form a retention volume of a component 20. It may be a relief provided in the depth of a layer of a substrate 30 or the association of parietal surfaces continuously surrounding or not the component 20, but at the very least used as a stopper in position along several directions. The wall of the cavities 2 means the space of the whole surface defining the volume of the cavity. Typically, the wall comprises a bottom positioned opposite the front face 21 of a component 20, and a part of the side wall having a dimension along the height of the receiving plate 1 (also corresponding to the height of the components accommodated therein, i.e. perpendicularly to the front face).

Figure 3:
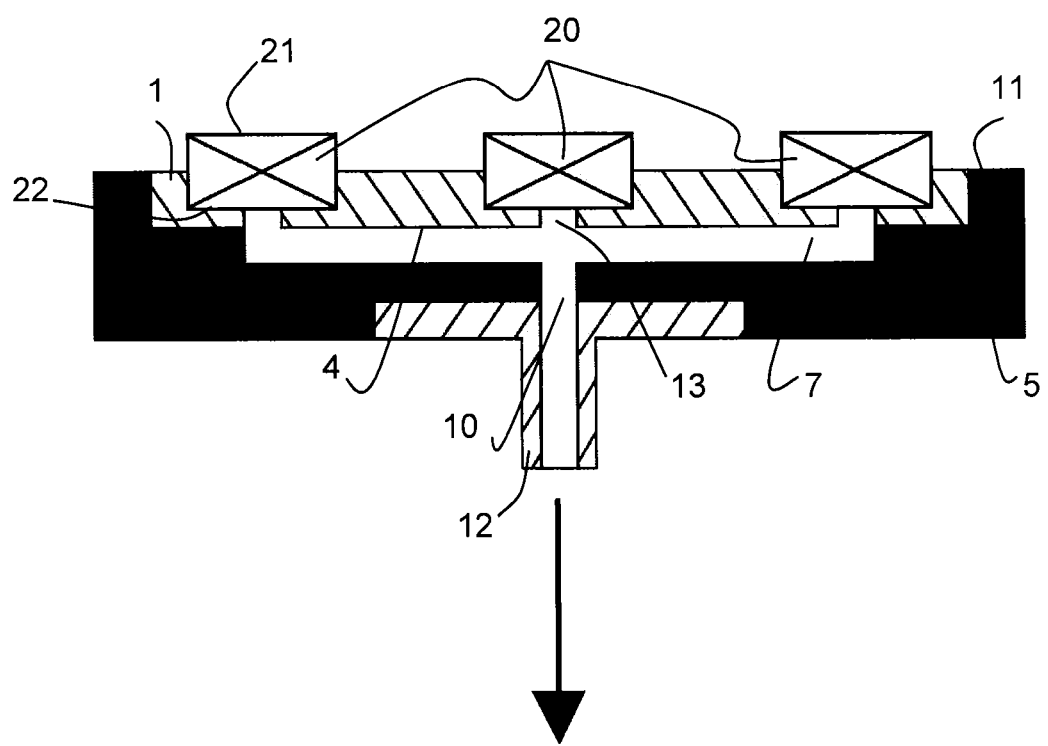
FIG. 3 shows, in section along the thickness of the device, a possible cooperation between said device and said components, with the application of a depression.

The invention potentially concerns all types of components. FIG. 3 schematizes an exemplary shape of such components 20. These have a front face 21 which can be used as an active face and more particularly as a face with which the component 20 will be positioned on a substrate. The front face 21 is advantageously planar and the front face 21 of all the components 20 is advantageously located in the same plane. The back face 22 is formed opposite the front face 21. Like in FIG. 3, it may be parallel to the front face 21. Side faces join the front face 21 and the back face 22. Globally, the components 20 may have the shape of a rectangle parallelepiped.

Typically such components may be produced on the same wafer, for example made of silicium, then cut off, using a diamond slitting wheel.

The invention is described hereinafter within the scope of the embodiments wherein the system includes other constituents, in addition to the receiving member 40 and the components 20. More particularly, in the cases described from FIGS. 1 to 4D, the supporting device is provided with a receiving plate 1. It should be noted that this part of the supporting device may advantageously cooperate with the supporting member 40 within the scope of a turning over of the components 20.

The invention may however also be applied to embodiments wherein no receiving plate is provided. More particularly, the supporting member 40 may be self-sufficient, in the invention.

The order of the description hereinafter, which starts with the presentation of the receiving plate 1 and of a base 5, explains by the writer's will, but discloses no order of priority of the characteristics which are described in details herein under.

The part of the device of the invention illustrated in FIG. 1 makes it possible to receive the dissociated components 20. Each of these is integrated in a cavity 2 of a receiving plate 1. The latter is advantageously made of silicon or any other material the properties of which are compatible with the technological applications to be produced such as aggressive cleaning operations.

The shape and the dimensions of the receiving plate 1 are preferably compatible with industrial micro-electronic machines and more particularly handleable by automatic robots. The shape and size of such cavities 2 are adapted to receiving the components. These are preferably recessed parts provided in the material of the receiving plate 1 although other configurations are possible. Lithography is a method which may be used to form the cavities 2.

The components 20 are inserted into the cavities 2 so that the back face thereof 22 penetrates the volume of the cavities 2. As the components 20 generally have the same geometry, the cavities 2 are advantageously similar, too. They preferably enable a treatment of the front face 21 of the components 20 and, for this purpose, the depth of the cavities 2 (i.e. the height between the bottom 14 thereof and the insertion opening of the components 20) is lower than the height between the front face 21 and the back face).

It should however be noted that the cavities 2 may secure the mechanical hold of the components 20. However, the size of the cavity 2 needs not be particularly adjusted, according to the invention, to the dimension of the component 20 to be received. The side wall of the cavity 2 is thus not necessarily in contact with the component 20. The supporting device may have other positions to hold the components 20 on the receiving plate 1. More precisely, conduits 13, more particularly visible in FIG. 3, provide a fluidic passage so that the back face 22 of the components 20 is recessed relative to the front face 21.

Each conduit 13 opens into a cavity 2, preferably at the bottom 14.

Several conduits 13 may open into the same cavity 2. The outcoming part of the conduit 13 may be executed as a hole through the thickness of the receiving plate 1 from the bottom 14 of the cavity 2 to the lower face 4 thereof (which is opposite an upper face 3 through which the components 20 are introduced into the cavities 2). An alternative solution consists in providing the conduits 13 with a part like a channel winding through the receiving plate 1 and opening into the cavity 2. The channel, as well as the holes may be executed by lithography. A diameter of 1 mm for each hole is satisfactory. For example, a hole having a diameter corresponding to approximately 10% of the largest dimension of the bottom 14 is acceptable. A suction of approximately 880 mbar enables most of the desired technological operations.

Figure 2:
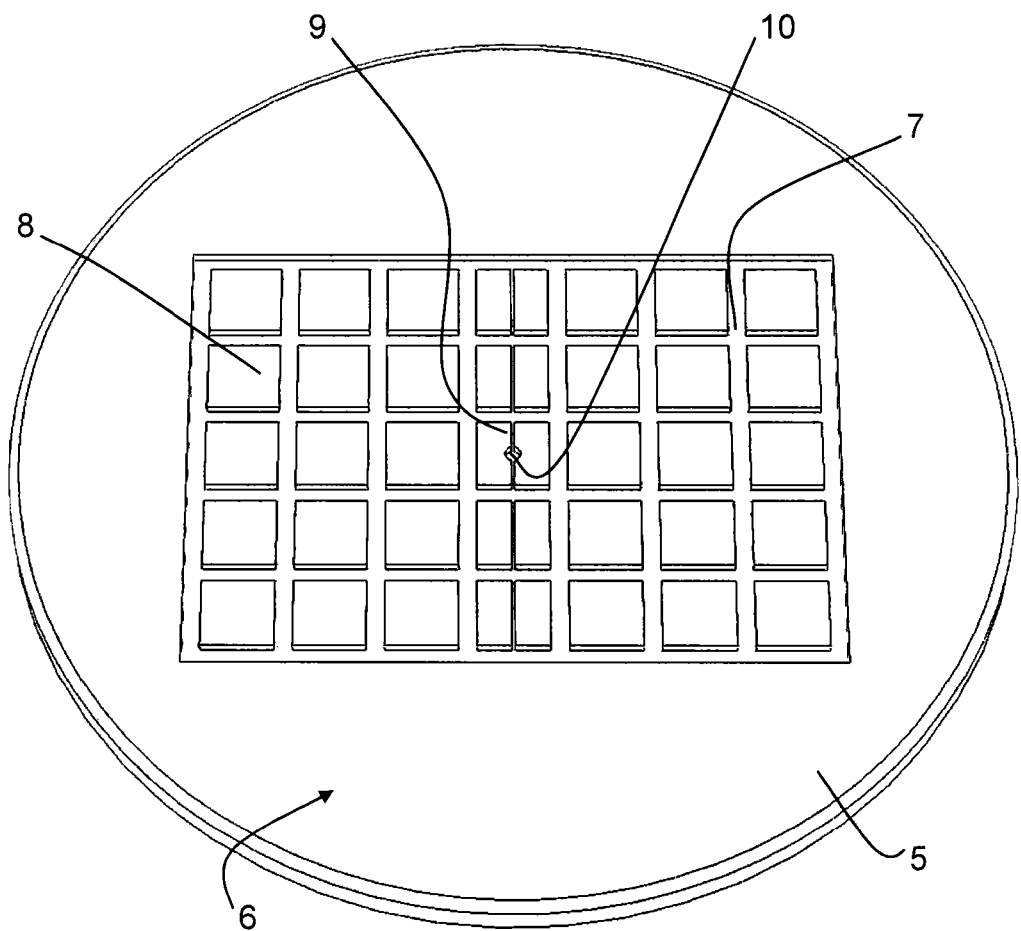
FIG. 2 shows another part of the device, as a top view of a base.

The receiving plate 1 may be sufficient for receiving the components 20 and ensure the depression of the back faces 22 thereof. It may however be associated with a base 5, an example of which is shown in FIG. 2. The base 5 is applied, by a so-called upper face 6, onto the lower face 4 of the receiving plate 1. When the base 5 and the receiving plate 1 are made of silicon, a direct gluing may ensure the assembling thereof. Mechanical elements, such as the rim 11 shown in FIG. 3 may also be implemented.

Generally speaking, the base 5 is advantageously used to form a part of the suction circuit, the conduits 13 of which are the terminal parts and to enable the interface with some external equipment. Such interface may be a mechanical mounting of the device in a machine (such as a plasma cleaning machine) and/or be a fluidic connection of the suction circuit.

FIGS. 2 and 3 show in greater details an embodiment of the base 5 and the cooperation thereof with the receiving plate 1. The upper face 6 of the base 5 comprises a part of a suction circuit having at least one channel 7 here recessed relative to the upper face 6. The channels 7 form therein an embossed pattern, for example obtained by lithography, with a communication between the channels for connecting same and providing a fluidic passage from a hole 10, illustrated in FIG. 2 at the centre of the base 5, via a branch channel 9. Typically, the channels 9, 7 are parallel or perpendicular grooves defining plots 8 between same. The channels 9, 7 are so positioned as to match the part of the suction circuit formed in the receiving plate 1 so that both parts of the suction circuit can communicate and each conduit 13 is in fluidic communication with the part of the circuit of the base 5. Communication is more particularly visible in FIG. 3.

The hole 10 advantageously extends through the base 5 toward the lower face thereof to enable the connexion to suction equipment. The incoming to position of the hole 10 thus forms a connection inlet 12.

The device of the invention may be implemented as follows:

constitution of a receiving plate 1 wherein the cavities 2 are adapted to the type of components 20 to be supported;

optional constitution of a base 5 complementary to the receiving plate 1 and enabling the interface of the device with at least one external equipment among which a suction system, if the external equipment is not directly compatible already;

assembling the receiving plate 1 and the base 5;

insertion of the components 20, each one in a cavity 2;

application of a depression onto the back face of the components 20 by suction through the conduits 13; during this phase, treatments may be carried out on the components and more particularly any cleaning operation on the front face 21 thereof. However, they are held in the cavities 2. The depression level of suction may be adjusted to the desired pull strength of the components 20.

Figure 4A:
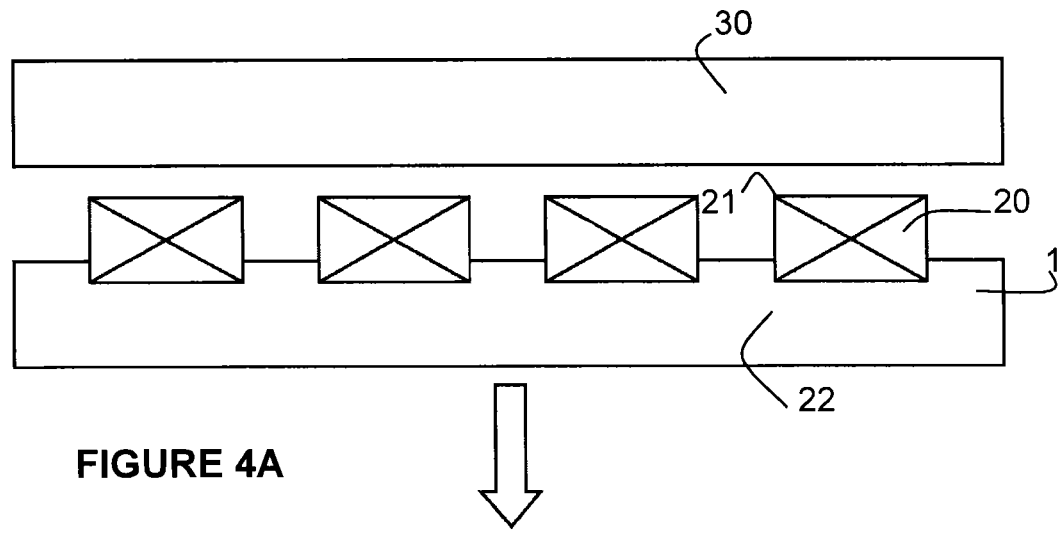
FIGS. 4A to 4C show the successive steps of direct gluing, wherein the components are collectively transferred from the supporting device to a receiving substrate.
Figure 4B:
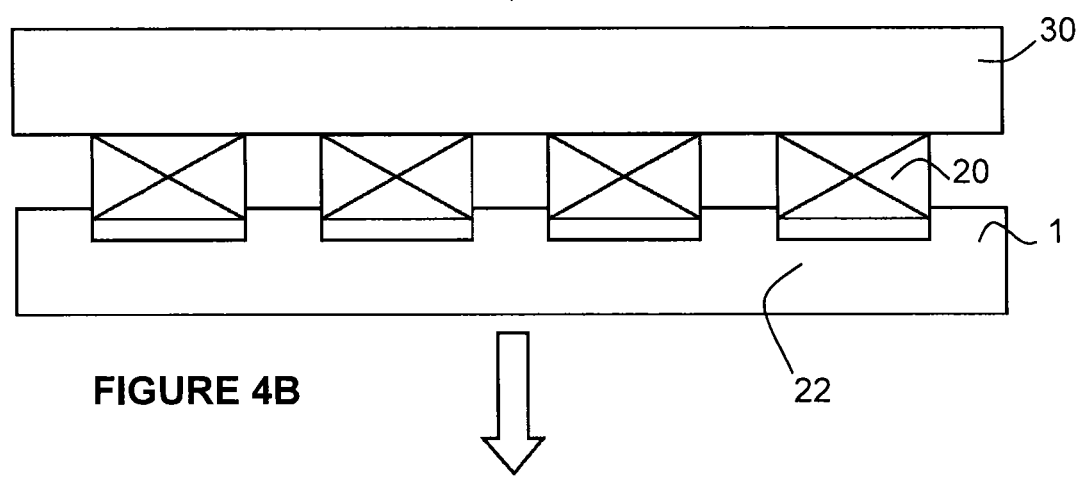
Figure 4C:
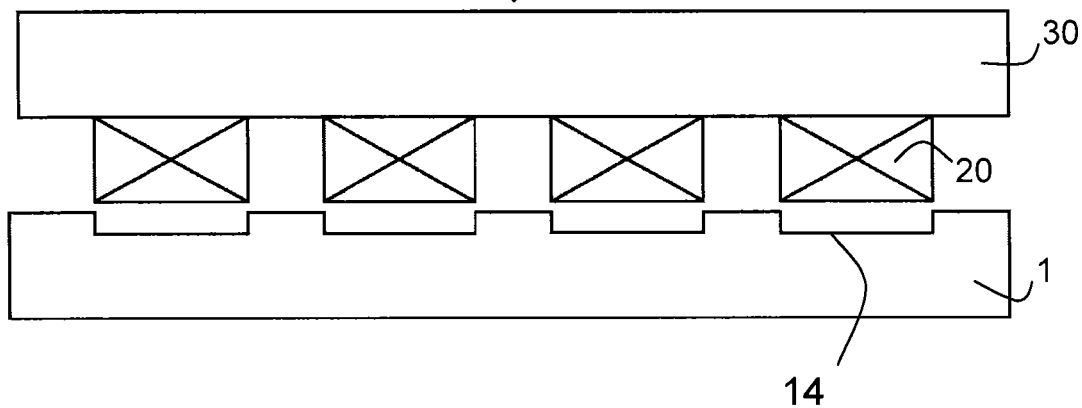

FIGS. 4A to 4C show another exemplary utilization of the device of the invention. Upon completed cleaning of the front face 21 thereof, the components 20 are transferred from the receiving plate 1 toward a substrate 30, by direct gluing. The receiving plate 1 and the substrate 30 are brought closer to one another, up to the contact of the front face 21 with the surface of the substrate 30, as shown in FIG. 4B. The gluing proper is performed during such step, while implementing the conditions required for the direct gluing and more particularly taking advantage of Van der Waals bond between the atoms of the surface of the substrate 30 and those of the front faces 21. A slight pressure may be applied when gluing.

A post-gluing annealing is executed to reinforce the adhesion energy. Water is eliminated from the droplets during this step.

In FIG. 4C, gluing is completed and the receiving plate 1 may be removed, with the back face 22 of the components 20 no longer being in contact with the bottom 14 of the cavities 2.

Thanks to the supporting technique of the invention implemented during the cleaning of the components, the applicant could see a significant improvement in the quality of the direct gluing corresponding to FIGS. 4A to 4C. During the tests, chips having a 200 nm (nanometers) thick layer of $SiO_2$ glue are added on a substrate 30 having a 200 nm thick $SiO_2$ superficial layer. A sound characterization of the gluing interface showed that the number and the quantity of defects (surfaces not glued) had substantially been reduced relative to a unit gluing following a unit cleaning of the chips (without the supporting device of the invention). Thus, with a collective gluing, 100% of the chips were glued, with 80% of chips being glued without any defect. The defect rate on all the components amounts to 0.2 defect/$cm^2$. When compared to the same number of components per unit gluing, only 96% of the chips are glued and only 15% of the chips are glued without any defect. The defect rate is ten times higher on all the components, i.e. 2 defects/$cm^2$.

It should then be noted that the quality of gluing is significantly improved when the chips are supported by the device of the invention during the cleaning thereof, thanks to the efficient mechanical support and the capacity of implementing any cleaning technique.

FIGS. 5A to 5D illustrate another embodiment of the invention. The device of the invention, associated to a plurality of components 20 forms a system comprising a supporting member 40.

Figure 5A:
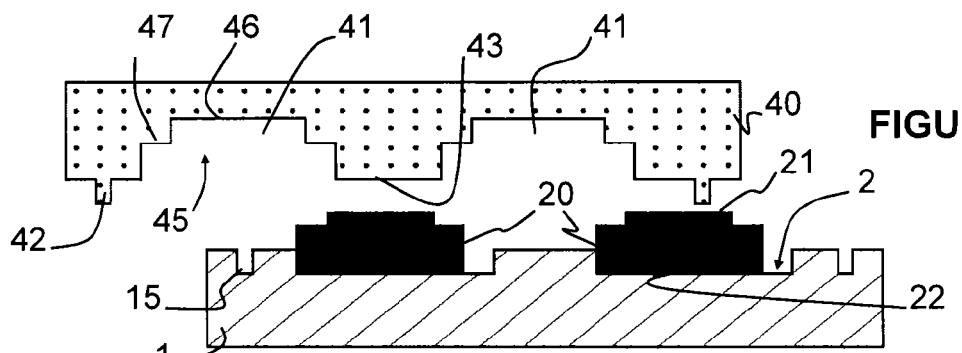
FIGS. 5A to 5D illustrate a possible use of the invention for the collective turning over of the components. The views also show an advantageous possibility of the invention wherein the surface of the front face of the components is not in contact with the supporting member of the components after the turning over.
Figure 5B:
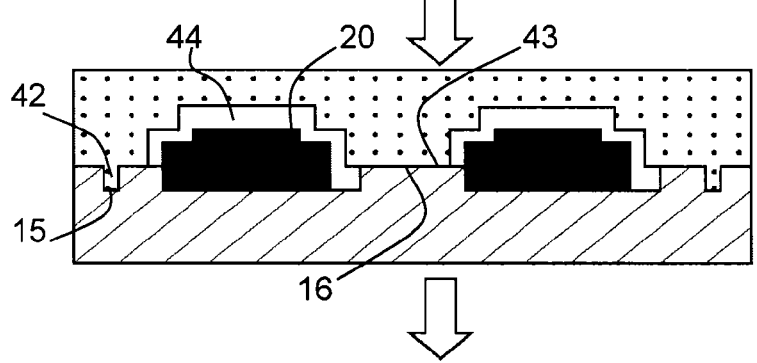
Figure 5C:
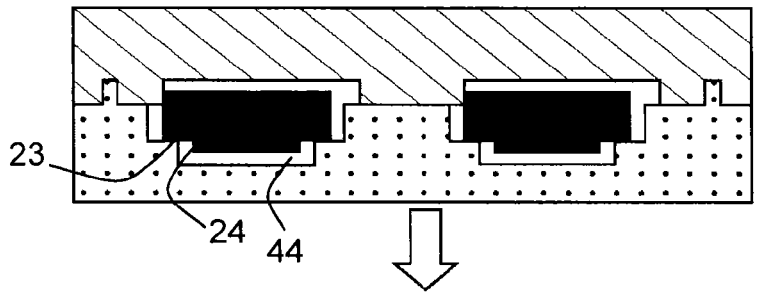
Figure 5D:
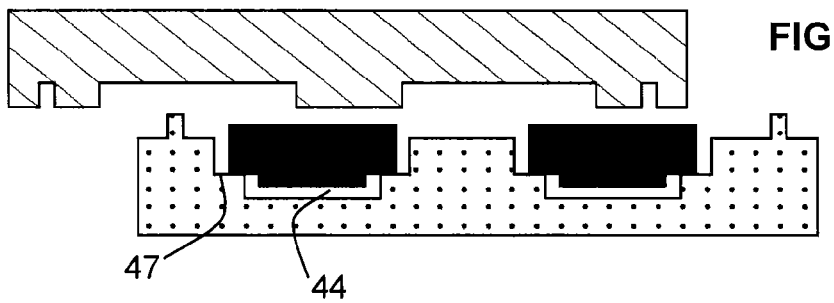

Referring directly to FIG. 5D, the cooperation between the supporting member 40 and the components 20 is shown in an advantageous configuration. Generally speaking, it should be noted that the components 20 are supported by the supporting member 40 without affecting the surface of the front face 21 of the components 20. This means that no surface support exists between the front face 21 and the supporting member 40. It should however be noted, while referring to FIG. 6, that a linear contact is possible, more particularly on the edge of the front face 21.

Referring to FIG. 5D again, the supporting member 40 is shown as a plate, for example made of silicon, wherein a plurality of cells 41 is formed, possibly by lithography, etching or mechanical machining. Each cell 41 has an internal volume delimited by a wall. Such wall advantageously comprises a bottom 46 and a part of wall between the bottom 46 and the aperture 45 of the cell 41 at the level of a front face 43 of the supporting member 40, a front face 43 through which the components 20 may be inserted into the cells 41.

The wall of the cells 41 comprises a continuous or not, surface or linear or punctual supporting zone, where a zone of a component 20, a so-called continuous or not, surface or linear or punctual contact zone, may be applied. Such application is so executed that a space 44 is preserved between the front is face 21 of the component 20 inserted into the cell 41, and the wall of the cell 41. Such space maintains the integrity of the front face 21 while avoiding the contacts which might bring particles onto the front face 21. The surface quality thereof can thus be preserved, more particularly after the cleaning of the front face 21.

Like the cavities 2, the cells 41 are advantageously so configured that the back face 22, here exposed outside the corresponding cell 41, is located above the level of the front face 43 of the supporting member 40.

In one embodiment, the supporting system of the invention comprises components 20 having a specific geometry to form the contact zone able to cooperate with the supporting zone of the walls of the cells 41. In FIGS. 5A to 5D, such geometry is such that an edge 23, located laterally relative to the front face 21, creates a contact zone at an intermediate height between the front face 21 and the back face 22. Advantageously, the edge is continuous around the front face 21. If the supporting zone of the wall of the cell 41 is continuous too, such disposition enables a complete closing of the space 44, thus providing a better protection of the front face 21. The edge 23 is advantageously uniform around the front face 21, with the same width and the same height corresponding to the step referenced 24 in FIG. 5C. For example, height of the step 24 around 10 µm (micrometers) is possible.

Although this should not be considered as restrictive, the step 24 is advantageously a planar surface oriented along the thickness of the component (i.e. the dimension between the front face and the back face). Such thickness forms the height of the step. Still preferably, the edge 23 is a planar surface extending from the foot of the step 24 to the periphery of the component. Such surface is advantageously oriented along a plane perpendicular to the thickness of the component.

Advantageously, the edge 23 is so configured that a minimum spacing, preferably greater than 100 µm, is maintained between the front face 21 and the wall, more particularly the bottom of the cell 41. Such spacing, much greater than the usual size of the particles liable to deposit onto the front face 21, prevents such particles, which may be present on the wall of the cell 41, to spoil the front face 21.

To take account of the manufacturing tolerances and space the front face 21 of the cell 41, the width of the cell 41 may be selected to be 200 µm greater than the width of the front face 21. The edges 23 are designed accordingly. It should then be noted that a manufacturing process of the contact zone of a component may comprise the following steps:

from a slice, called a <<wafer>>, creation of a plurality of components;

with a cutting tool having a first width (such as a diamond slitting wheel), formation of spot-facing between the components of the wafer;

with a second cutting tool, having a second width smaller than the first width, cutting of the components at a median level of the spot-facing so as to dissociate the components while forming the edges 23 by the residual surface of the spot-facing.

The edge 23 may also be obtained by other means, among which lithography.

In another embodiment, which may be combined or not with the previous mode wherein the components comprise an edge 23, the cells 41 comprise a stepped part of wall 47. The whole or a part of the supporting zone is provided on this part.

Figure 6:
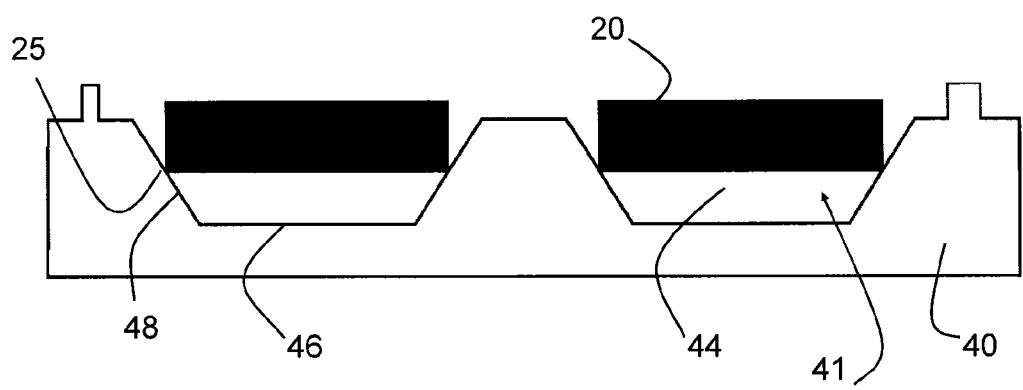
FIG. 6 shows an alternative configuration for the supporting member.

FIG. 6 shows another embodiment of the supporting system of the invention wherein the wall of the cells comprises sloping parts 48 ensuring narrowing of the cell 41 toward the bottom 46 thereof. An inclination along an angle between 30° and 60°, and for example 45°, relative to the front face 21 of the component 20 is possible. In the case of a component 20 having the shape of a rectangle parallelepiped, the inclined parts 48 of a cell may advantageously form a pentahedron frustrum part like a pyramid, with the supporting zone thus being continuous, on a contact zone of the component 20 provided by the complete rim 25 of said component. Such rim 25 may be the closed line bordering the front face 21. This cell 41 shape may be associated with the component shape, having an edge 23, as shown in FIGS. 5A to 5D, and then the linear contact rim 25 is the line of the external rim of the edge 23.

Whatever the embodiment of the supporting member 40, the system is such that the contact between the cells 41 and the front face 21 of the components 20 is a linear contact at most.

FIGS. 5A and 5D illustrate an advantageous exemplary utilization of the supporting member 40, wherein the latter is used for turning over the components 20 from a position wherein the front face 21 of the components 20 is exposed outward, to a position wherein the back face 22 thereof is exposed. The resulting configuration may more particularly be used to grip the components 20, by the back face 22 thereof, without touching the front face 21 whereas the techniques known as <<Pick and Place>> imply steps of gripping by the two faces.

In FIG. 5A, the components 20 are supported by the receiving plate 1 advantageously of the type previously described. The latter thus preferably shows a suction conduit for each cavity 2, although not shown in FIGS. 5A to 5D.

Thus positioned, the front face 21 of the components 20 is exposed to the outside of the cavities 2 and the back face thereof to the inside of the cavities 2. Technological operations may be carried out in this configuration, among which a cleaning phase. The supporting member 40 and the receiving plate 1 are then brought closer to one another until they touch, as shown in FIG. 5B. In this representation, a part of the front face 43 of the supporting member 40 rests on a stopping surface 16 of the receiving plate 1. Optionally, the assembly is secured by a mechanical cooperation of the male connector 42, or female connector 15 type, each one being formed on one of the supporting member 40 and the receiving plate 1.

In this situation, the supporting zone of the cells 41 and the contact zone of the components 20 may not touch yet. This is the case in FIG. 5B but this is not restrictive.

To have the configuration of FIG. 5C, a rotation is executed. The motion may be more complex than a rotation around one axis, but the result remains reaching a reverse position of the supporting member 40 and of the receiving plate 1. More particularly, the supporting member 40 is then preferably positioned so that the contact zones of the components 20 are applied by gravity onto the supporting zones of the cells 41.

During the step of turning over, provisions are advantageously made to avoid an untimely displacement of the components 20. For this purpose, suction may be applied in the conduits 13. Additionally or alternately, the adjustment of the contact zone and of the supporting zone in this situation of FIG. 5B may be such that the motions of the components are blocked or limited during the phase of turning over.

In an alternative solution, not illustrated, the supporting member 40 is not active during the phase of turning over. In this case, the receiving plate 1 holds the components by suction, executes the required rotation and places the turned components opposite the cells 41 of the supporting member 40, so as to apply the contact zones of the components 20 onto the supporting zone of the cells 41 or so that the stopping of suction causes the application by gravity.

Whatever the turning over mode, during the step shown in FIG. 5D, the receiving plate 1 may be removed. The components 20 supported by the supporting member 40 remain, with no contamination of the front face 21 of the components 20. The latter may, for example, be individually handled by the back face 22 thereof for gluing with a very accurate positioning.

Figure 7A:
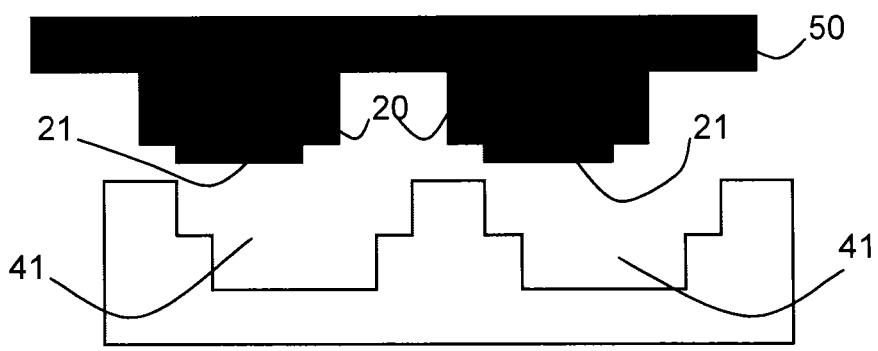
FIGS. 7A to 7C are the successive steps of a technological treatment of components originating from the same substrate, use being made of the system of the invention.
Figure 7B:
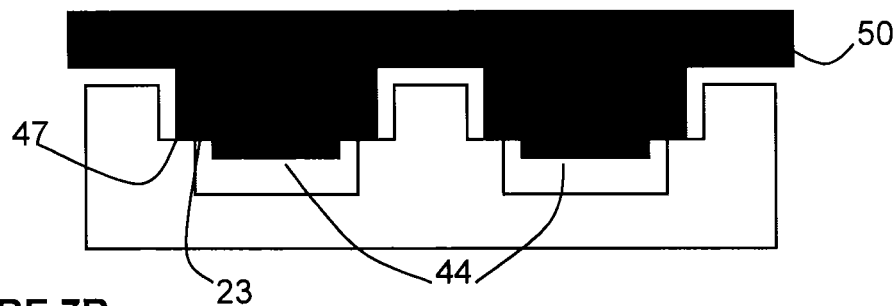
Figure 7C:
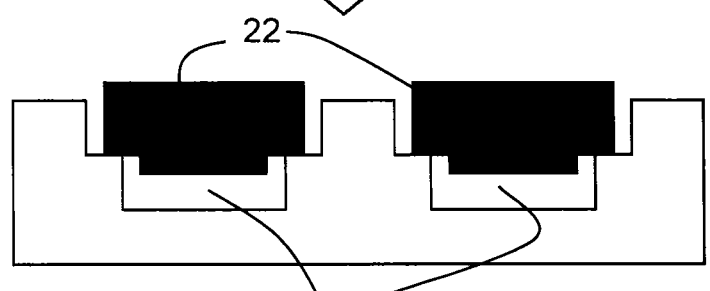

FIGS. 7A to 7B provide another embodiment of the invention wherein the components 20 are turned over differently.

The components 20 are provided on a substrate 50, for example, from a layer of silicon. The front faces 21 thereof are already formed and advantageously cleaned. The known cleaning technologies for the surface of whole substrates can then be implemented. Upon completion, the components 20 are placed opposite the supporting member 40 and then introduced into the cells 41 by the front face 21 thereof. Such introduction stops when the contact zones of the components 20 are applied on the supporting zones of the cells 41. This configuration is shown in FIG. 7B.

In this situation, the supporting zones and the contact zones are in relative application, which immobilises the substrate 50. Advantageously, the only surfaces in contact are the so-called supporting and contact zones. Still advantageously, the components 20 formed on the substrate 50 protrude from one face of the substrate and the support and the components are so configured that said face of the substrate is raised relative to the supporting member 40.

The components 20 must then be released from the substrate 50. A method used for this purpose consists in thinning the substrate, for example by rectification or grinding, from the face of the substrate 50 opposite the one where the components 20 are positioned. Thinning goes on until the face of the substrate 50 whereon the components are positioned is reached, so that these are released, and constitute the back faces 22 thereof.

In an alternative solution, not illustrated, the supporting member 40 comprises, for each cell 41, a suction assembly, which may for example, be similar to the one described for the cavities 2 of the receiving plate 1. More particularly, an additional suction circuit may also make it possible to create a depression of the front face 21 relative to the back face 22, so that the components 20 are efficiently held in the cells 41.

Conventionally, the opposite faces of the components 20 have previously been called the front face 21 and the back face 22. The front face 21 of the given examples is active in a direct gluing on a receiving substrate. Nevertheless, the invention is not limited to this example and the roles of the front 21 and back 22 faces could be different.

The invention claimed is:

1. A system for individually supporting at least one component comprising a front face and a back face opposite the front face, the system comprising:
   a supporting device comprising a member configured to support the at least one component, the member being provided with a plurality of cells,
   each cell of the plurality of cells being delimited by a wall and including a zone configured to support a contact zone of the at least one component, at least a part of the plurality of cells each receiving a component by a front face thereof,
   the supporting zone and the contact zone being configured so that a surface of the front face of the at least one component is not in contact with the wall of said each cell,
   wherein the contact zone of the at least one component is located on a periphery of the front face and forms a closed zone around the front face,
   wherein the supporting zone forms a closed zone on the wall of said each cell, and
   wherein the contact zone of the at least one component includes an edge surface set back in a thickness direction with respect to the front face of the at least one component, the thickness direction extending from the front face to the back face and being perpendicular to at least one of the front face and the back face.

2. The system of claim 1, wherein the edge surface is set back with respect to the front face by a step having a constant height.

3. The system of claim 1, wherein the wall of said each cell and the edge surface are configured to provide a free space of at least 100 micrometers between the front face and a bottom part of the wall of said each cell.

4. The system of claim 1, wherein the plurality of cells each include an aperture, a bottom, and a stepped part of the wall located at an intermediary depth between the bottom and the aperture, with said stepped part of the wall forming at least partially the supporting zone.

5. The system of claim 4, wherein the contact zone and the supporting zone are configured to expose the back face at a height above that of the aperture of the plurality of cells.

6. The system of claim 1, wherein the contact zone and the supporting zone form a planar support along a plane parallel to a plane of the front face.

7. The system of claim 1, wherein the member includes a suction circuit opening into each cell of the plurality of cells and configured to recess the front face of the at least one component with respect to the back face.

8. The system of claim 1, wherein the supporting device includes a receiving plate provided with a plurality of cavities, each being configured to receive a component of the at least one component by the back face thereof, and for each cavity, at least one suction conduit opening into said cavity so that the component of the at least one component is positioned in said cavity so the back face is recessed with respect to the front face thereof, with the receiving plate and the member being configured so that at least a part of the plurality of cavities are located opposite the at least a part of the plurality of cells when a front face of the member is opposite an upper face of the receiving plate.

* * * * *